US006851170B2

(12) United States Patent
Lappen et al.

(10) Patent No.: US 6,851,170 B2
(45) Date of Patent: Feb. 8, 2005

(54) METHOD AND APPARATUS FOR ALIGNMENT OF CARRIERS, CARRIER HANDLERS AND SEMICONDUCTOR HANDLING EQUIPMENT

(75) Inventors: Alan Rick Lappen, San Martin, CA (US); Ronald Vern Schauer, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 386 days.

(21) Appl. No.: 10/021,998

(22) Filed: Dec. 14, 2001

(65) Prior Publication Data

US 2003/0110611 A1 Jun. 19, 2003

(51) Int. Cl.⁷ .............................. B23Q 3/00; B23P 21/00; B25B 27/04
(52) U.S. Cl. .............................. 29/464; 29/466; 29/468; 29/712; 29/281.5
(58) Field of Search .......................... 29/464, 466, 468, 29/428, 525, 700, 712, 718, 281.5; 211/41.18; 206/711

(56) References Cited

U.S. PATENT DOCUMENTS 6,216,874 B1 * 4/2001 Bores et al. ................. 206/711
6,300,644 B1   10/2001 Beckhart et al.
6,307,211 B1   10/2001 Beckhart et al.

OTHER PUBLICATIONS

SEMI E15–0698, Specification for Tool Load Port; © SEMI 1990, 1998; 8 pp.
SEMI E15.1–0600, Specification for 300mm Tool Load Port, © SEMI 1996, 2000; 11 pp.
SEMI E47–95, Specification for 150mm/200mm Pod Handles, © SEMI 1995, 2000; 4 pp.
SEMI E47.1–0200, Provisional Mechanical Specification for Boxes and Pods Used to Transport and Store 300mm Wafers, © SEMI 1997, 2000; 18 pp.
SEMI E47.1–0699, Provisional Mechanical Specification for Boxes and Pods Used to Transport and Store 300mm Wafers, © SEMI 1997, 1999; 18 pp.
SEMI E62–0299, Provisional Specification for 300mm Front–Opening Interface Mechanical Standard (FIMS), © SEMI 1997, 1999; 10 pp.
SEMI E62–0999, Provisional Specification for 300mm Front–Opening Interface Mechanical Standard (FIMS), © SEMI 1997, 1999; 9 pp.

* cited by examiner

Primary Examiner—John C. Hong
(74) Attorney, Agent, or Firm—Konrad Raynes Victor & Mann, LLP

(57) ABSTRACT

A carrier alignment tool system in accordance with a preferred embodiment of the present invention provides a tool and method of using the tool, which emulates the door of a substrate carrier having a removable door. The tool permits the alignment between a door opener mechanism and the load-port or other handler, on which a carrier is to be supported to be tested and corrected, until proper alignment is achieved prior to beginning substrate processing.

40 Claims, 12 Drawing Sheets

US 6,851,170 B2

METHOD AND APPARATUS FOR ALIGNMENT OF CARRIERS, CARRIER HANDLERS AND SEMICONDUCTOR HANDLING EQUIPMENT

FIELD OF THE INVENTIONS

The present inventions relate to carriers for carrying semiconductor substrates and equipment for handling semiconductor substrates, and more particularly, to methods and apparatus for aligning semiconductor substrate carriers and handling equipment.

BACKGROUND OF THE INVENTIONS

Semiconductor substrates such as wafers are often processed in processing lines, which generally comprise a number of stations. One such station is depicted in FIG. 1 and generally indicated at 10. The station 10 comprises a transfer chamber 11 with a suitable platform (not shown). Several process chambers (four in this example) 12 are mounted at four facets of the transfer chamber 11, which, in this example, has six facets. Two load lock chambers 13 are mounted on two other facets of the transfer chamber and connected to the mini-environment (also called Factory Interface, FI) 15, which is also shown in FIG. 2. A robot schematically indicated at 14 operates to transfer the wafers from the load lock chambers 13 to and between the process chambers 12. Examples of such a station are the Centura or Endura, available from Applied Materials, Inc of Santa Clara, Calif.

The mini-environment, generally indicated at 15, serves as a clean environment for wafer scheduling and handling. Such a mini-environment may be a SMIF-300 Wafer Management System available from Asyst Technologies, Inc. of Fremont, Calif. It includes an enclosure 16 and several (two in this example) wafer pod loaders 21 and 22 for wafer pods 23 and 24 (FIG. 2), respectively. Each wafer pod 23, 24 contains a stack of wafers to be processed by the station 10. The enclosure 16 houses one or more robots (two in this example) 25 and 27 for transferring the wafers 28 from the pods to the load lock chamber 13. A suitable track robot is available from Equipe Technologies of Sunnyvale, Calif. The robot 27,29 is also used to transfer wafers to and from the wafer aligner 18.

The workstations could be differently structured and, for instance, comprise other elements, such as a buffer chamber, pre-clean and cool-down chambers, pre-processing and post-processing chambers, and so on.

The transformation of wafer disks into integrated circuit chips often involves several steps where the disks are repeatedly processed, stored and transported. Due to the delicate nature of the disks and their extreme value, it is preferred that they are properly protected throughout this procedure from contaminants. One purpose of a wafer carrier is to provide protection from these contaminants. One type of wafer carrier referred to as a pod or box can completely enclose the wafers to facilitate such protection. The wafer pods 23, 24 depicted in FIG. 2 illustrate one example of such a wafer pod which is often formed primarily of plastic.

Since the processing of wafer disks is generally automated, it is preferred for the pod or carrier to precisely align the wafer disks according to the specifications of the processing equipment being used. To seat and align the pods 23, 24, each wafer pod loader 21, 22 has a load-port 30, 31 through which the robots 25,27 transfer the wafers from the pods to the load lock chambers. The tolerances available for aligning the pods or other carriers are generally very tight, such as around 0.20 mm, for example, for proper interaction between the processing equipment and the wafer disks. Internationally recognized standards have been published which specify many of these tolerances. For example, the SEMI (Semiconductor Equipment and Materials International, formerly known as Semiconductor Equipment and Materials Institute) E47.1-0699 standard partially specifies the boxes and pods used to transport and store 300 mm wafers in an IC manufacturing facility.

One pod or box which complies with E47.1 is known as the Front-Opening Univerisal Pod (FOUP) and has a non-removable cassette and a front-opening interface that mates with a load-port that complies with SEMI E62, entitled "Provisional Specification for 300 mm Front-Opening Interface Mechanical Standard (FIMS)." More specifically, the pod has a door positioned on the front side of the pod, which corresponds to the front side of the cassette where wafers are accessed. In this standard, the pod door is perpendicular to the wafers and parallel to a specified facial datum plane so that the door and its frame can mate with an FIMS port that conforms to SEMI E62. For proper mating, the door and its frame should have surfaces that mate with the seal zones and the reserved spaces for vacuum application defined in SEMI E62 as well as properly latch to the port. The doors and walls of the pod are typically fabricated from plastic.

The physical alignment mechanism from the pod to the tool load-port (or a nest on a handler) includes receptacles such as those indicated at 100a–100c (in phantom) in FIGS. 10 and in FIGS. 11a–11b, which are located on the bottom wall 102 of each pod such as a pod 103. Typically, the receptacles are molded or cast or cast from plastic integrally with the bottom wall of the pod. Alternatively, each receptacle may be formed separately and attached to the under side of the pod wall 102. Suitable fasteners such as rivets, bolts or screws may be passed through a flange on each side of the receptacle to secure the receptacle to the underside of the pod. The receptacles may also be glued or welded to the pod underside.

As best seen in FIGS. 11a–11b, each of the pod receptacles as represented by receptacle 100a, has a generally inverted V-shaped groove 108 formed in the underside of the receptacle and positioned to mate with a kinematic coupling pin such as pin 110a disposed on a support plate 111 of a tool load-port. The receptacles 100a–100c are intended to mate with three or six such coupling pins as specified in SEMI E57 entitled "Provisional Mechanical Specification for Kinematic Couplings Used to Align and Support 300 mm Wafer Carriers," 1997; 1990, which is incorporated by reference in its entirety. In SEMI E57, it is recommended that each of the V-shaped grooves extend along a line that is perpendicular to and co-planar with the nominal wafer centerline as shown in FIG. 10. The grooves are intended to provide adequate alignment even when the grooves are shrunken or slightly misaligned (such as when they do not all line up with the nominal wafer center line).

As best seen in FIG. 10, the SEMI E57 standard has defined three sets of kinematic coupling pin locations with two possible pin locations in each set. A pin located in the outer position is designated a primary pin and is indicated at 110a. In a conventional load-port, each load-port would have three such primary pins 110a–110c arranged in a triangle pattern as shown in FIG. 10. The three primary kinematic coupling pins form a nest 112 on which the receptacles 100a–100c of a pod may be placed as shown in phantom in FIG. 10.

Each set of possible pin locations also includes an inner location. A pin located in the inner position is designated a secondary pin and is indicated in phantom at 110d–110f. In a conventional pod handler or other transport robot or load-port, the handler could have three such secondary pins 110d–110f arranged in a triangle pattern to form a nest on which the receptacles 100a–100c of a pod may be placed as shown in phantom in FIG. 10. The location of each primary and secondary pin is specified with respect to three orthogonal datum planes defined in SEMI E57: the horizontal datum plane, the facial datum plane, and the bilateral datum plane.

The shape of these prior kinematic coupling pins is also specified in SEMI E57. As set forth therein and best seen in FIGS. 11a and 11b, each pin 110a–110c (or 110d–110f) is radially symmetric about its vertical center axis line 120. Each pin includes a generally cylindrical base portion 122 and a generally spherical top portion 124 disposed at the top of the pin. The spherical top portion 124 is shaped to facilitate contact with a flat plate. Disposed between the spherical portion 124 and the cylindrical portion 122 is an intermediate rounded frusto-conical surface 126 which is shaped to facilitate contact with angled mating surfaces. The rounded surface 126 has radii of curvature as indicated by radii 130a and 130b.

Other mating schemes are also contemplated within SEMI E57, such as a pyramid-shaped opening in a wafer carrier receptacle. It is also contemplated that front-opening boxes and pods may need to contact the pins on the side to provide pressure against a front mechanical interface. When designing the mating features of the receptacles on the bottom of the wafer carriers, SEMI E57 recommends that designers follow the recommendations given in the book entitled "*Precision Machine Design*" by Dr. Alexander H. Slocum, Society of Manufacturing Engineers, Item Code 2597, 1992 (originally published by Prentice-Hall, 1992).

SUMMARY OF THE PREFERRED EMBODIMENTS

A carrier alignment tool system in accordance with a preferred embodiment of the present invention provides a tool and method of using the tool, which emulates the door of a substrate carrier having a removable door. The tool permits the alignment between a door opener mechanism and the load-port or other handler on which a carrier is to be supported, to be tested and corrected until proper alignment is achieved prior to beginning substrate processing.

In one embodiment, the tool system includes a frame assembly having a plurality of removable inserts which emulate the door holes for receiving a registration pin and which also emulate the door key holes for receiving the keys of the door opener mechanism. Because the inserts are slidably removable within the frame assembly, alignment can be tested while reducing the danger of damage to the opener mechanism. In yet another aspect of the present inventions, various sets of key hole and registration pin hole inserts may be provided having various sizes of key holes and registration pin holes. As a consequence, alignment may be tested and corrected to various tolerance levels.

In yet another aspect various components of the frame assembly including a door emulation member and pod receptacle emulation members may be configured to be removable to facilitate substituting other components to emulate other standards. In addition, worn components may be readily replaced.

There are additional aspects to the present inventions as discussed below. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined only by the appended claims and their equivalents.

BRIEF DESCRIPTION OF THE DRAWINGS

FIG. 3b is a top view of the metrology tool system of FIG. 3a.

DETAILED DESCRIPTION OF THE DRAWINGS

Figure 2:
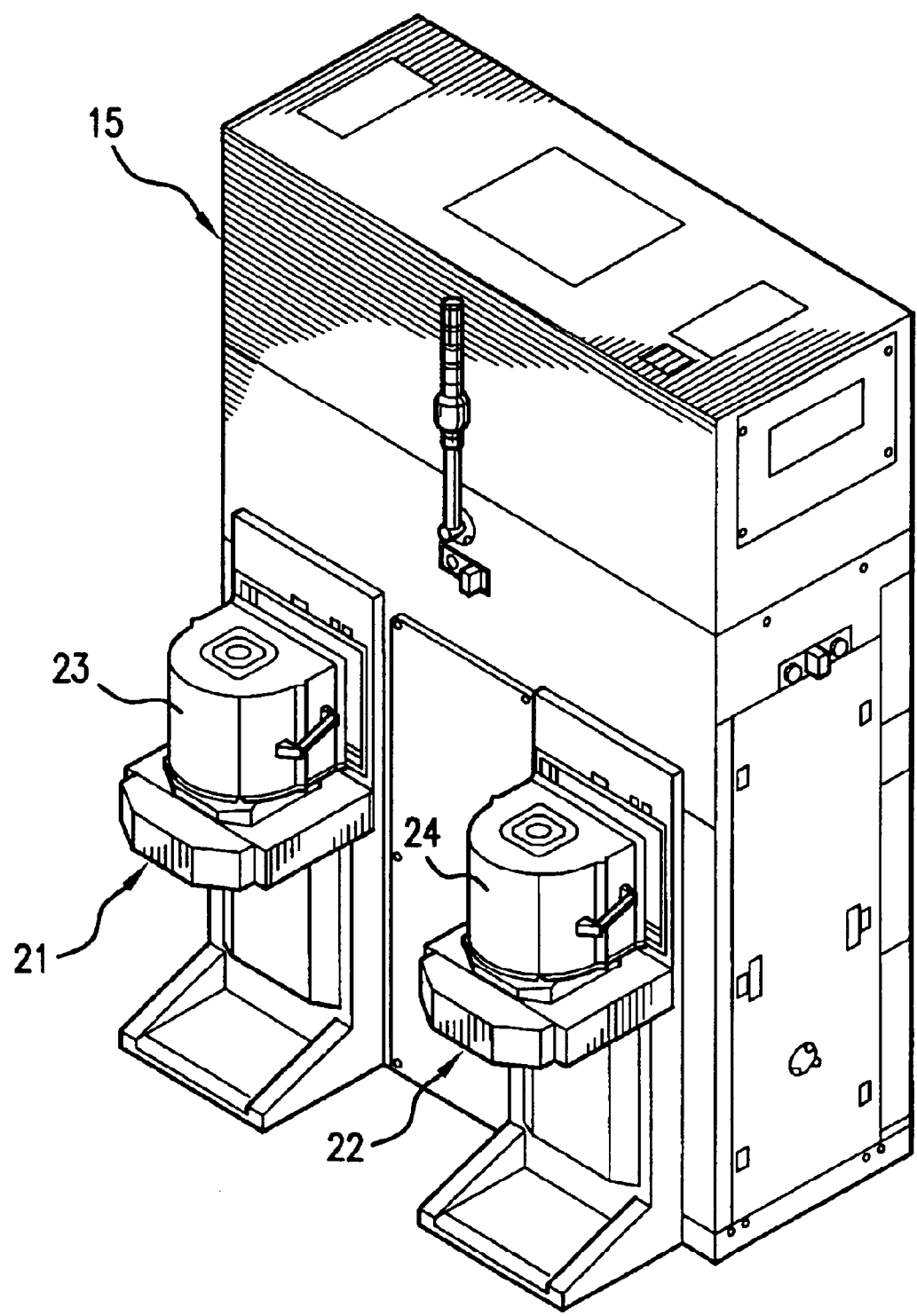
FIG. 2 is a pictorial view of the minienvironment of the processing station of FIG. 1.
Figure 3A:
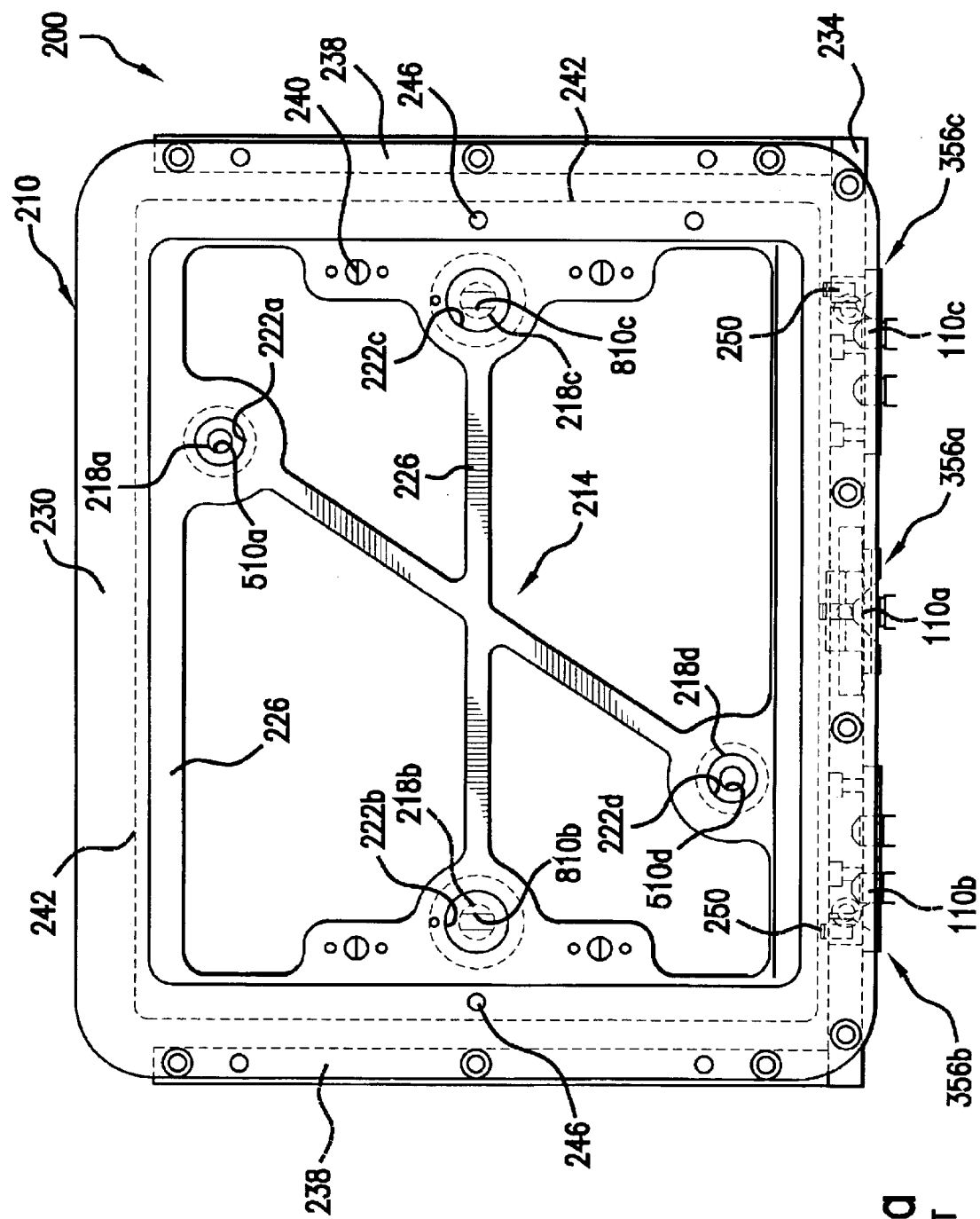
FIG. 3a is a front elevational view of a metrology tool system in accordance with a preferred embodiment of the present inventions.
Figure 3B:
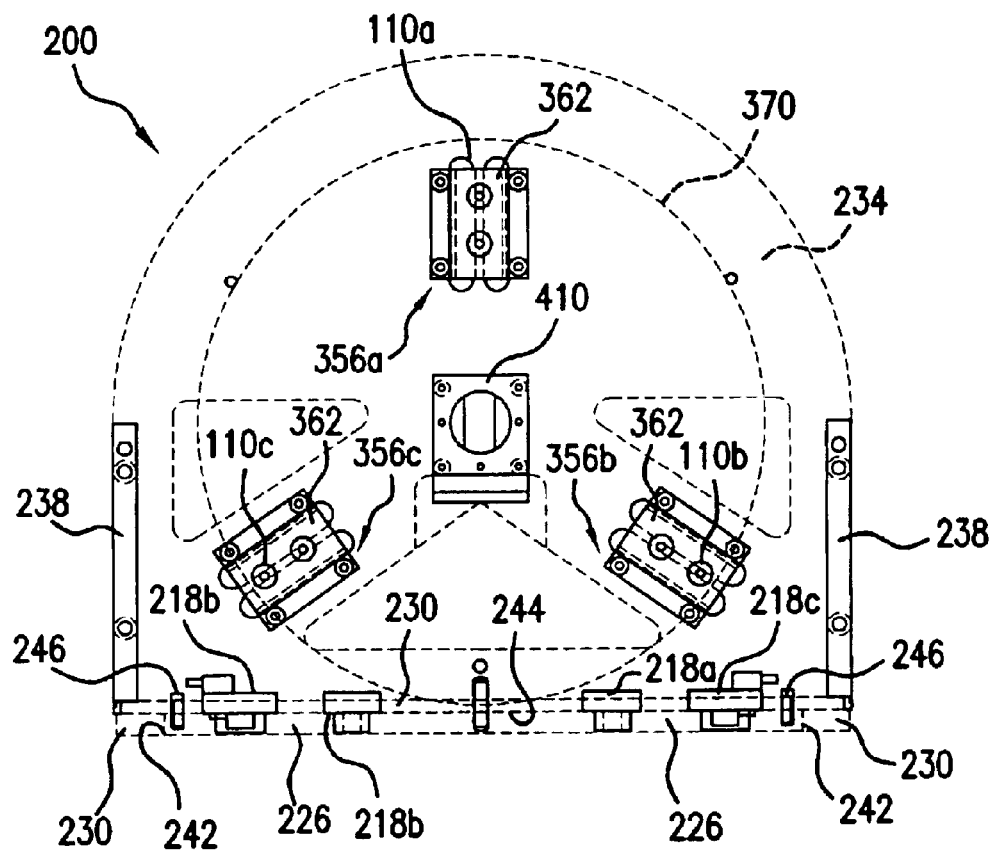
Figure 3C:
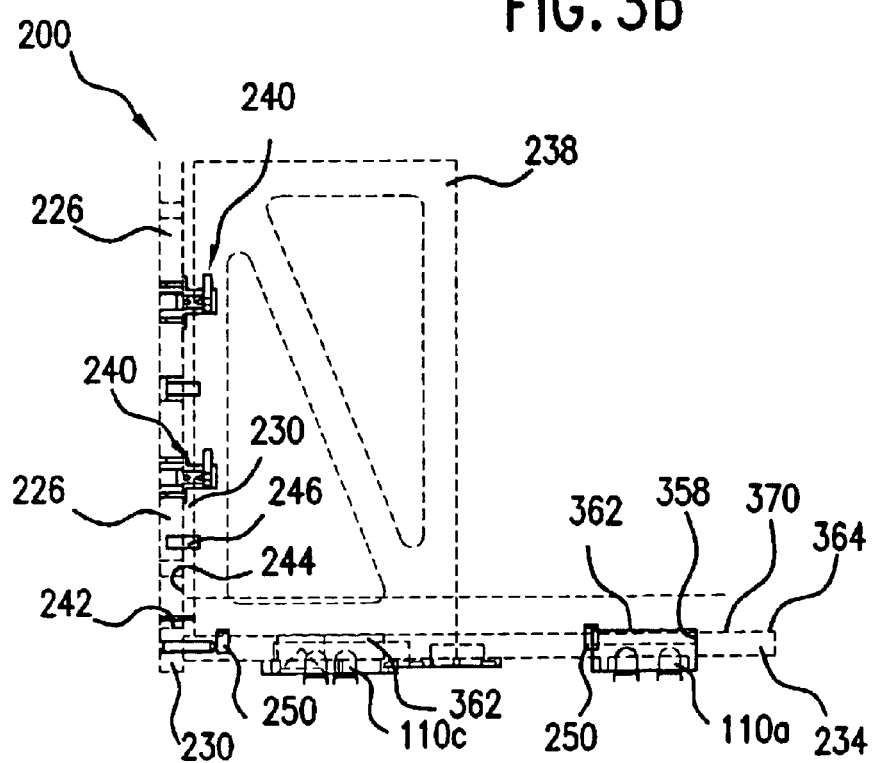
FIG. 3c is a side elevational view of the metrology tool system of FIGS. 3a–3b.

A carrier alignment tool system in accordance with a preferred embodiment of the present invention is indicated generally at 200 in FIGS. 3a, 3b and 3c. The carrier alignment tool 200 comprises a metrology carrier frame assembly 210, which is secured to the carrier platform of a tool-port or other carrier handler in a manner substantially similar to that of an actual wafer carrier such as the carrier 23 of FIG. 2 and thus emulates the wafer carrier 23. For example, the metrology carrier rests upon coupler pins 110a–110c of the carrier tool-port to align the metrology carrier with respect to the tool-port. In addition, in one embodiment, the metrology frame assembly 210 approximates the size and weight of a production wafer cassette full of wafers.

The carrier alignment tool system 200 may be used with processing systems having one or many processing chambers and one or more factory interfaces for transferring workpieces from one or more carriers to one or more loadlock chambers coupled to one or more of the processing chambers. Once a particular handling system has been properly aligned and calibrated, the metrology carrier tool 200 may be removed from the tool-port and processing of workpieces may begin using a standard workpiece carrier which was emulated by the metrology tool 200. However, it is preferred that all tool-ports of a particular processing system be properly aligned prior to initiating processing of production workpieces.

In the illustrated embodiments, the metrology carrier tool 200 can accurately and repeatably represent the published and established mechanical dimensional standards of a 300 mm FOUP. In one embodiment, the components of the tool 200 are formed from a relatively rigid and machineable material such as hardened steel, for example. It is recognized that other metals and other nonmetal materials may be used, depending upon the particular application. It is further recognized that the metrology carrier tool 200 can emulate other carriers both standard and custom or proprietary.

In one aspect, the frame assembly 210 of the metrology carrier tool 200 includes a door emulation assembly 214 (FIG. 3a) which is precision manufactured from steel or other suitable material to emulate the specified dimensions of a standard 300 mm FOUP door (including tolerances). As explained in greater detail below, the door assembly 214 may be used to test factory automation door openers for compliance with SEMI or other application specifications. Such testing may be conducted at the point of manufacture of the door opening mechanism or may be conducted in the field where the opener is used in the manufacture of semiconductor devices. The door assembly 214 includes a plurality of removable and interchangeable inserts 218a–d to facilitate aligning a door opening mechanism to differing tolerance standards, depending upon the particular needs at the time. The inserts 218a–218d have openings which are preferably precisely positioned and sized to emulate alignment registration points and opening features utilized by the door opening mechanism of the factory interface.

The inserts 218a–d may also be formed of hardened steel and are received in four openings 222a–222d, respectively of a door plate member 226 (FIG. 3a) of the door emulation assembly 214. The door plate member 226 is in turn secured to a generally rectangular front frame member 230 which is supported by a bottom plate member 234 (FIG. 3b) of the frame assembly 210. A pair of side brace members 238 (FIG. 3c) secured to the bottom plate member 234 and the front frame member 230 provides additional strength and rigidity to the frame assembly 210. The plate and brace members may be formed of hardened steel or other, preferably relatively inflexible, materials.

In the illustrated embodiment, the door plate member 226 is secured to the rectangular front frame member 230 by suitable latches 240 which permit the door plate member 226 to be removed from the door assembly and a substitute door plate member 226 latched in its place. The substitute door plate member may emulate a wafer carrier door fabricated to a different standard or may replace a damaged or worn out door plate. The substitute door plate is aligned with respect to the front frame member 230 of the tool by peripheral alignment surfaces 242 on the outer periphery of the door plate member 226 and a recess 244 formed in the front frame member 230 to receive the door plate member 226. Alignment between the door plate member 226 and the front frame 230 may be further facilitated by a plurality of alignment pins 246 which pass through both the plate 226 and the frame 230. Alignment pins 250 may also be used to facilitate alignment between the other components of the tool assembly.

Figure 4:
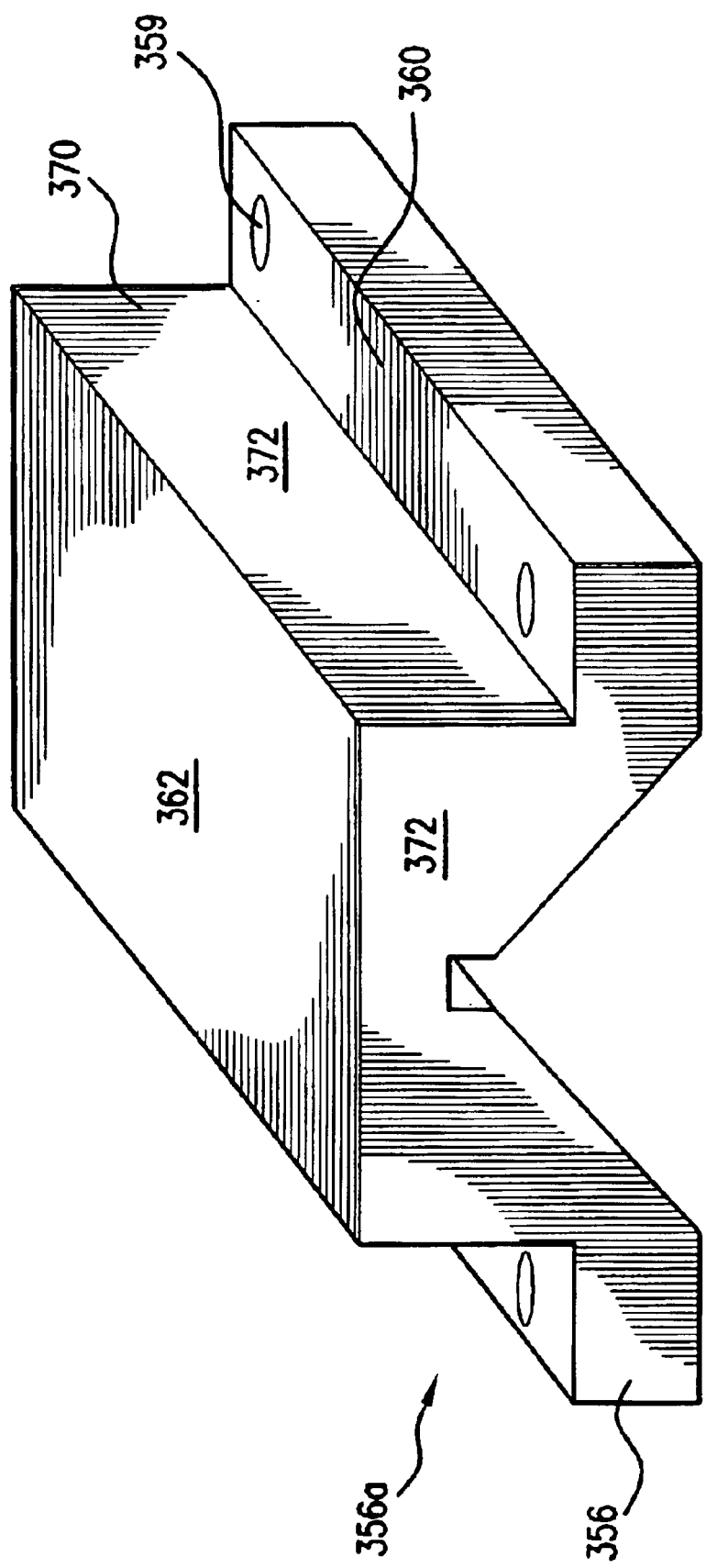
FIG. 4 is a pictorial view of a receptacle of the metrology tool system FIGS. 3a–3c.

The bottom wall 362 of the bottom plate member 234 has three receptacles 356a–356c (also depicted in phantom in FIG. 3a) secured to the bottom wall 362 of the carrier. In the illustrated embodiment, each receptacle 356a–356c is formed as a removable separate piece (FIG. 4) of steel or other suitable material, which is received in a generally rectangular opening 358 formed through the bottom wall 362 of the bottom plate member 234. Suitable fasteners such as rivets, bolts or screws may be passed through openings of a flange 360 on each side of the receptacle to secure the receptacle to the underside of the bottom plate member. The fasteners are preferably removable fasteners. Alternatively, the receptacles may be integrally formed with the carrier tool.

To precisely align the receptacles to the tool frame, each receptacle has a blocked shaped portion 370 (FIG. 4) having four alignment surfaces 372 which engage four alignment surfaces which form the rectangular aperture 358 in the bottom plate member 234. Once a receptacle wears out and is no longer in conformance with the applicable standard, or to emulate a different standard, the receptacle may be removed and a substitute receptacle fastened to the frame. Proper alignment of the substitute receptacle may be facilitated by providing appropriate alignment surfaces such as the surfaces 372 to engage the alignment surfaces of the frame aperture 358.

Figure 1:
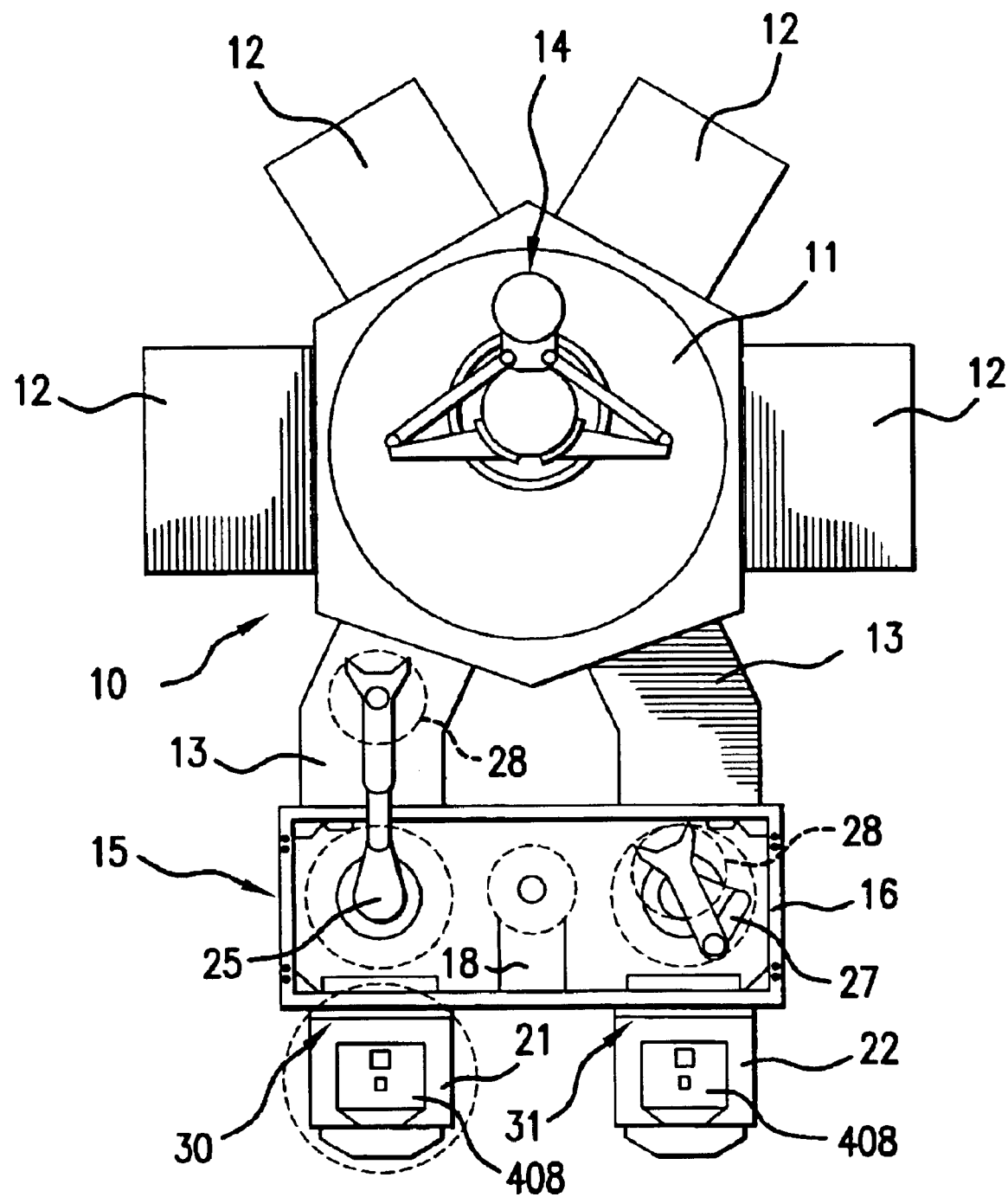
FIG. 1 is a top schematic view of a processing station for use in connection with a metrology tool system in accordance with a preferred embodiment of the present inventions.
Figure 10:
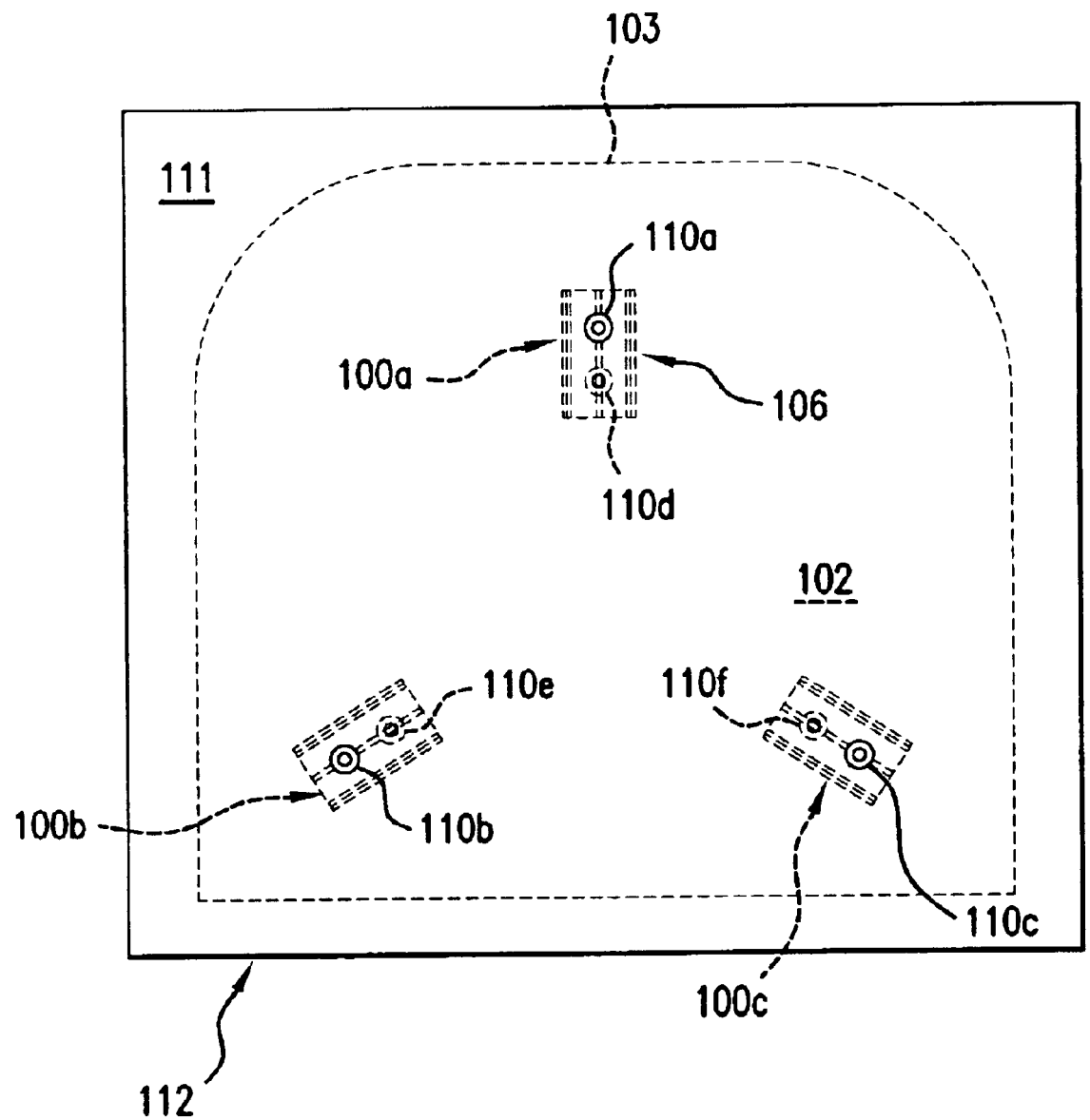
FIG. 10 is a schematic diagram illustrating primary and secondary prior art kinematic pin locations.
Figure 11A:
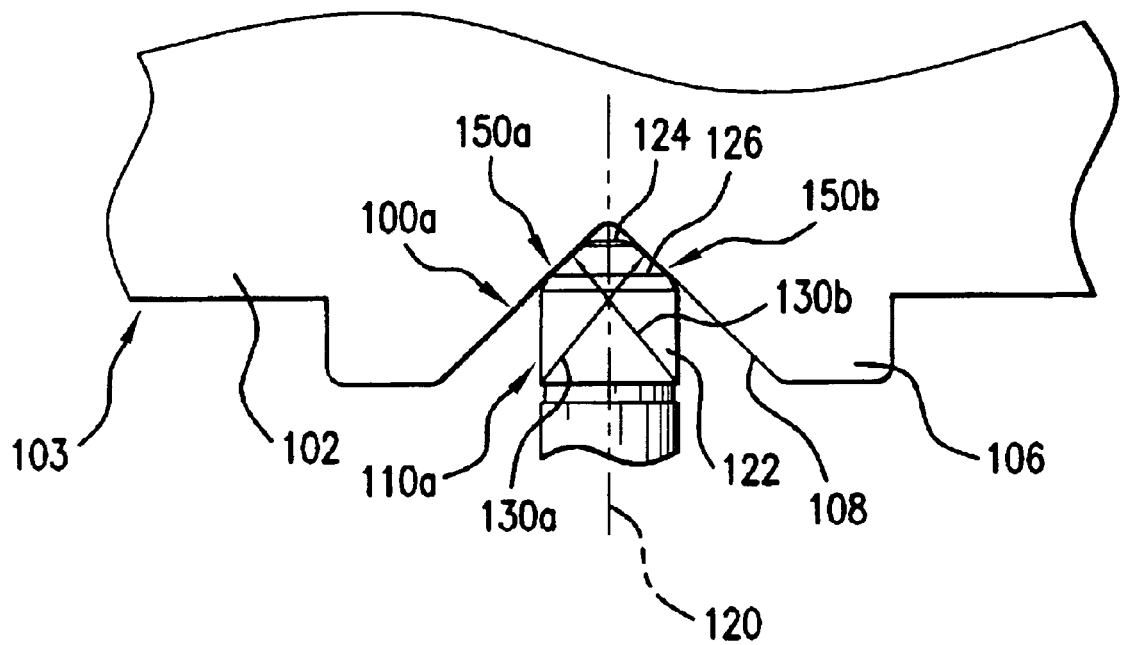
FIG. 11a is a broken away front elevational view of a carrier receptacle resting on a prior art kinematic pin.
Figure 11B:
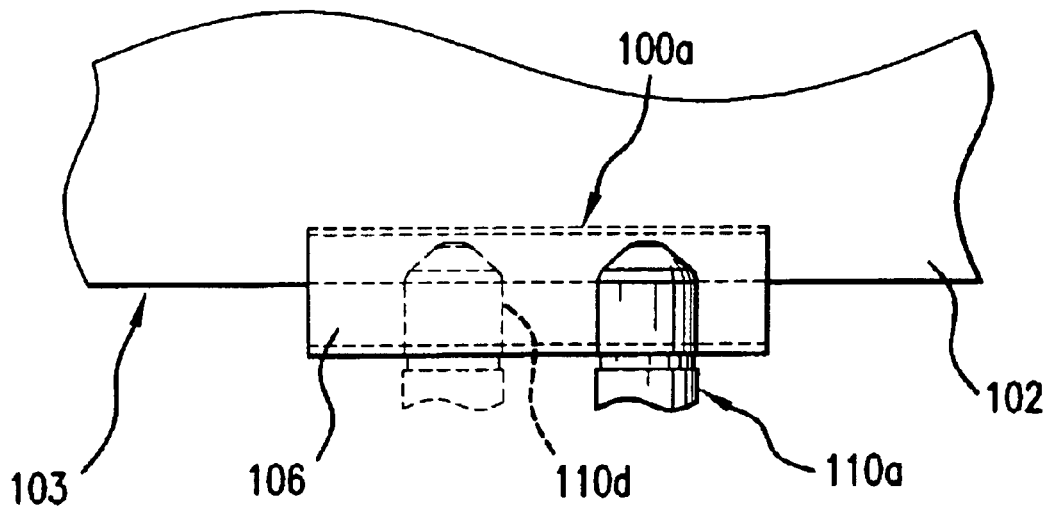
FIG. 11b is a broken away side elevational view of a carrier receptacle resting on a prior art kinematic pin.

The three carrier receptacles 356a–356c are shown resting on three support and alignment coupling pins 110a–110c of the same type as the coupling pins of FIGS. 10 and 11a–11b. The three coupling pins 110a–110c are precisely positioned and secured to a support member such as a support plate 408 of a load-port such as load-port 21 (FIGS. 1, 2) to form a nest to support the carrier tool. The tool has a hold down cap 410 secured to the bottom plate member 234, which may be engaged by the load-port to hold the metrology tool down onto the coupling pins of the load-port.

The receptacles 356a–356c in engaging the couplings pins 110a–110c, align the bottom plate member 234 of the frame assembly 210 to the support platform of the tool-port. Since the door plate member 226 is secured to the front frame member 230 which is in turn secured to the bottom plate member 234, the openings 222a–222d are likewise aligned with respect to the tool-port. Other types of couplings may be used as well. For example, copending application Ser. No. 09/668,012 filed Sep. 21, 2000 and entitled METHOD AND APPARATUS FOR ALIGNMENT OF CARRIERS AND SEMICONDUCTOR PROCESSING EQUIPMENT (Applied Materials Docket No.: 04674/IBSS/IBSS/DV) and assigned to the assignee of the present application, describes a coupling having a longitudinal shape which is believed to improve alignment between the carrier and the processing equipment while maintaining sufficient compliance with appropriate standards.

Figure 5:
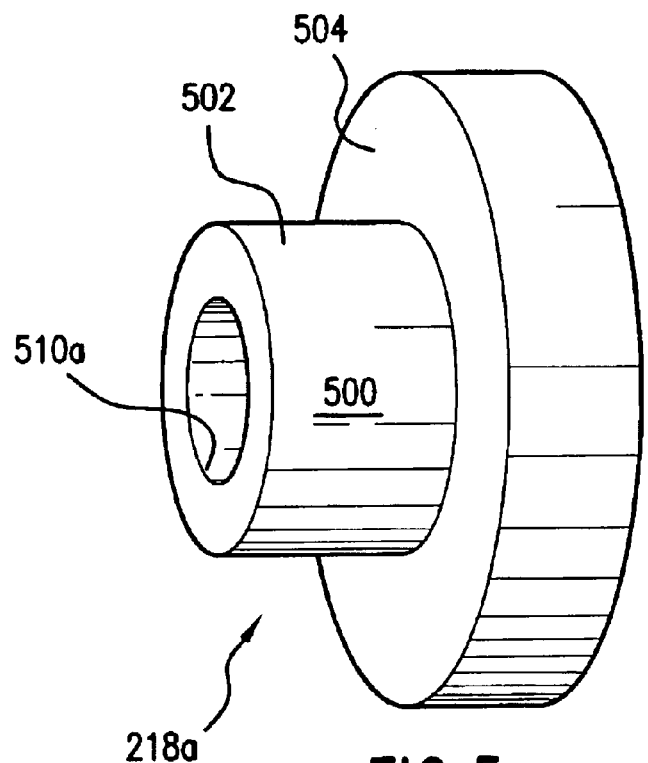
FIG. 5 is a pictorial view of a registration pin alignment insert of the metrology tool system of FIGS. 3a–3c.
Figure 6A:
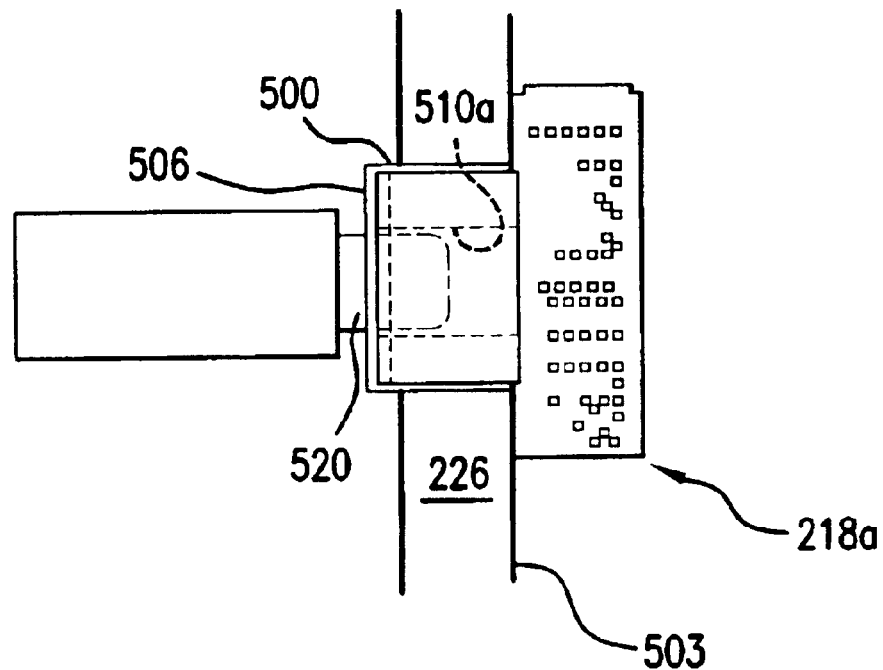
FIGS. 6a and 6b are side partial cross-sectional views of a registration pin being aligned with a registration pin alignment insert of the metrology tool system of FIGS. 3a–3c.
Figure 6B:
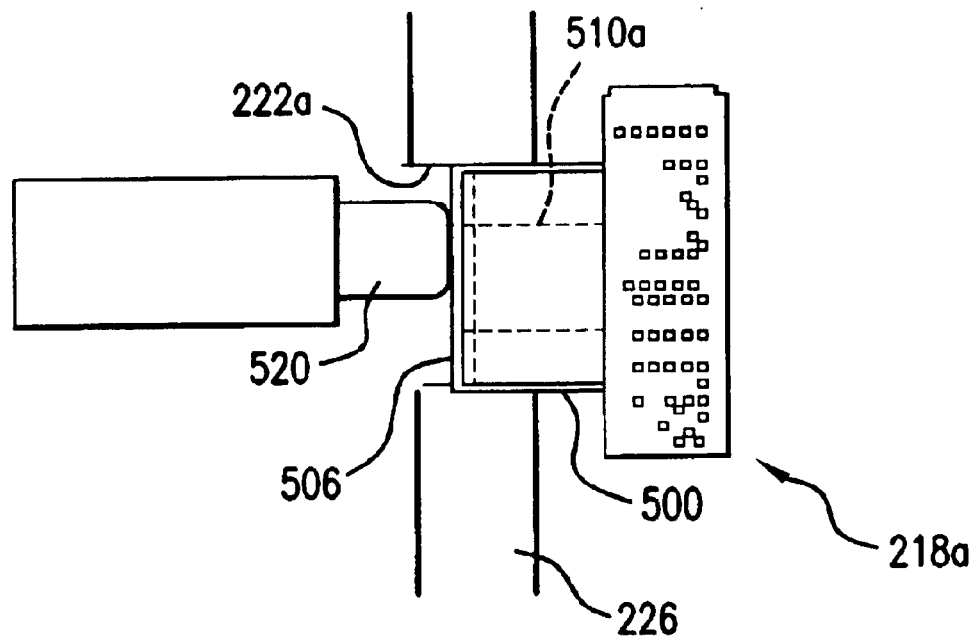

As best seen in FIGS. 5 and 6a–6b, the insert 218a has a generally cylindrical outer surface 500 of an insert body 502 which is received by the generally cylindrical shaped opening 222a of the door plate member 226. The body 502 of the insert 218a is inserted into the opening 222a from the back side 503 of the door plate member 226 until a flange 504 at the rear of the insert 218a engages the back surface 503 of the door plate member 226. The front surface 506 of the insert 218a defines a generally cylindrical shaped opening 510a which is shaped and dimensioned in accordance with the SEMI standard E62-0299, Provisional Specification for 300-mm Front Opening Interface Mechanical Standard (FIMS), 1997,1999, for one of the two FOUP door alignment registration pin holes. When the insert 218a is inserted into the opening 222a of the door plate member 226, the insert opening 510a is positioned in accordance with the SEMI standard E62-0299 for one of the two FOUP door alignment registration pin holes. The insert 218d is constructed in a similar manner such that the insert opening 510d of the insert 218d is positioned in accordance with the SEMI standard E62-0299 for the other of the two FOUP door alignment registration pin holes. In this manner, the insert openings 510a and 510d emulate the two SEMI E62-0299 FOUP door alignment holes for two registration pins.

The alignment of the carrier tool-port to the factory interface FOUP door opener mechanism may be tested by commanding the door opener mechanism to insert the engagement members or heads 520 of the door opener registration pins into the two alignment registration holes 510a and 510d emulating the two alignment registration holes of a door of a FOUP type carrier. If the carrier support platform of the carrier tool-port is properly aligned with respect to the factory interface FOUP door opener mechanism, the head 520 of the registration pin will be received into the corresponding door alignment registration pin hole as illustrated in FIG. 6a for the alignment hole 510a of the insert 218a. On the other hand, if the door opening mechanism and the tool-port are misaligned, the head 520 of the opener mechanism will engage the front surface 506 of the alignment insert 218a and begin to push the insert 218a out of the insert opening 222a in the door plate member 226. This movement of the insert provides a clear indication to the operator of the misalignment condition.

In the illustrated embodiment, the inserts are preferably not fastened or otherwise secured to the door plate member such that the inserts can freely slide within the associated plate member opening. As a consequence, should the opener mechanism and carrier tool-port not be properly aligned, the inserts can freely slide indicating misalignment while reducing the danger of accidental damage to the opener mechanism.

In accordance with another aspect of the present inventions, the alignment tool system 200 may include a plurality of removable inserts for each plate member opening 222a and 222d. The inserts could differ, for example, by the diameter of the opening 510a or 510d of the inserts. Thus, for example, one set of inserts 218a and 218d could have openings 510a and 510d, respectively, which are relatively large, such as 0.3671 inch (9.32434 mm) diameter, for example. This diameter is substantially larger (approximately 104%) than the 0.354331 inch (9 mm) diameter specified in the SEMI E62-0299 specification for the door registration pin openings. These larger opening inserts may be used if an alignment to a relatively large tolerance is desired for the particular application. Another set of inserts 218a and 218d could have openings 510a and 510d, respectively, which are relatively small, such as 0.3550 inches (9.017 mm), for example, yet still slightly larger (approximately 100.2%) than a specified 9 mm opening. These inserts may be used if an alignment to a relatively small tolerance is desired for the particular application. Yet another set of inserts may have an opening of exactly 0.354331 inch (9 mm), the diameter specified in the SEMI E62-0299 specification.

Depending upon the application, the alignment tool system may include a kit having a number of inserts having a variety of different sized openings to provide the type of alignment desired. These inserts may be used in a particular sequence, such as, for example, using the inserts with the larger openings to align the robot to a relatively large tolerance first. Then, a substitute insert having a smaller opening may be substituted for the initial insert to align the robot to the tighter tolerance.

Figure 7A:
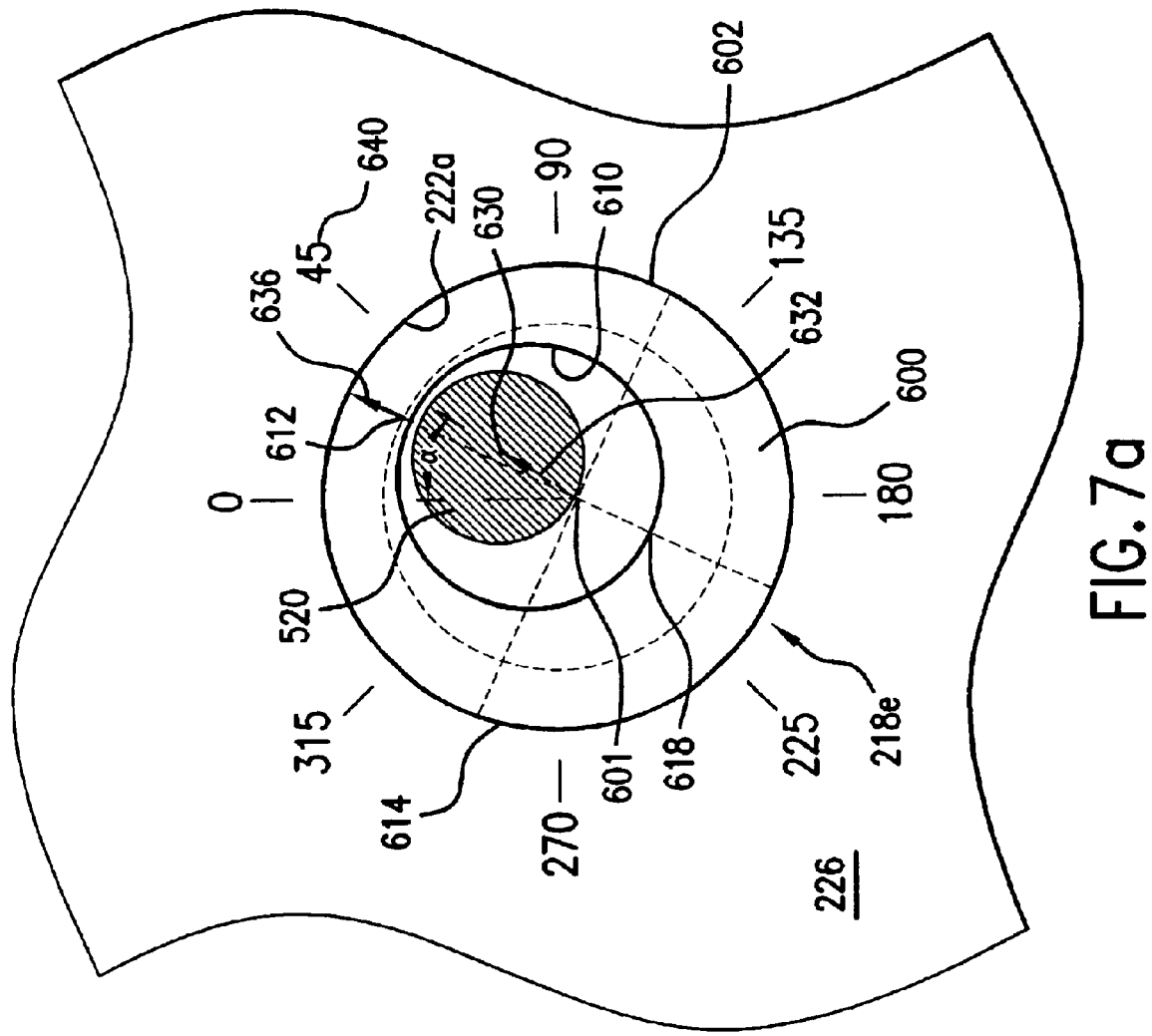
FIGS. 7a–7c are schematic front views of a registration pin being aligned with a diagnostic registration pin alignment insert of the metrology tool system of FIGS. 3a–3c.
Figure 7B:
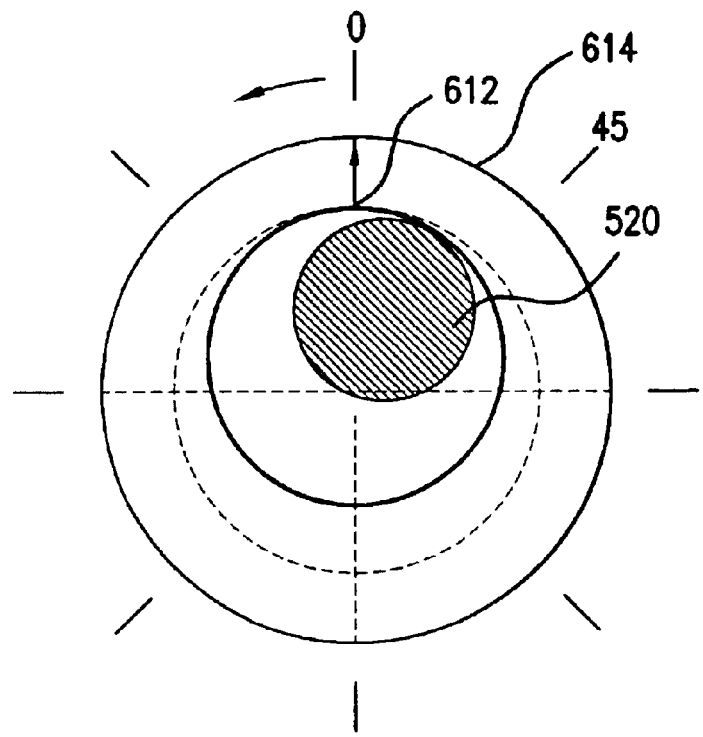
Figure 7C:
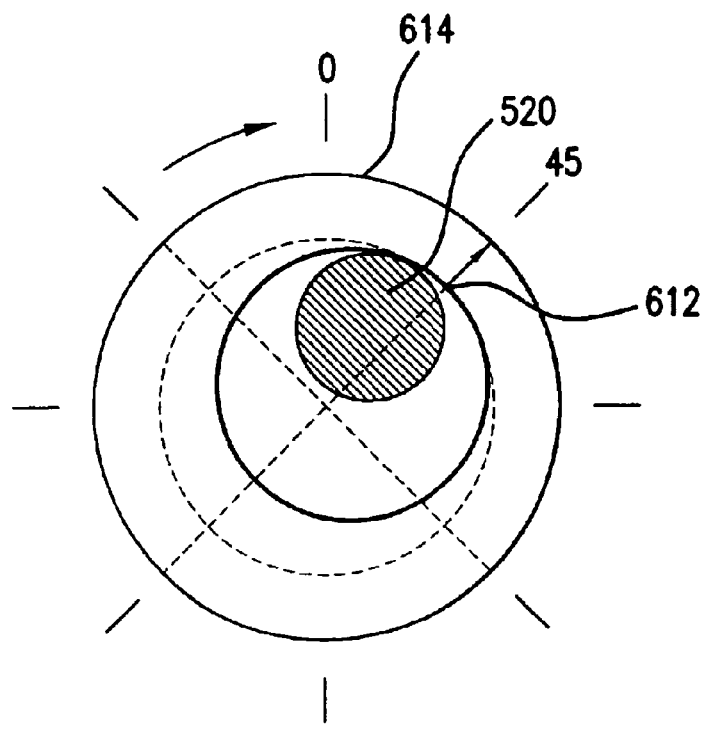

In the embodiment of FIG. 5, the insert 218a has a registration pin opening 510a which is formed concentrically within the cylindrical surface 500 of the body 502 of the insert 218a. In accordance with another aspect of the present inventions, FIGS. 7a–7c illustrate another insert 218e which may be included in the kit of the alignment tool system. The front face 600 of the insert 218e is shown extending through the cylindrically-shaped opening 222a in the door face member 226 of the door frame assembly. The opening 222a defines a central longitudinal axis represented by point 601. The registration pin alignment insert 218e has a generally cylindrical insert body 602 concentrically positioned (co-axial with axis 601) with respect to the face member opening 222a. The insert body 602 defines a registration pin opening 610 which is also generally cylindrically-shaped but is not concentrically positioned within the body 602. Instead, the registration pin opening 610 is positioned off-axis such that one side 612 of the opening 610 is positioned farther from the central axis 601 and closer to the cylindrical body surface 614 of the insert body 602 than the opposing side 618 of the insert opening 510. Such an eccentric arrangement may be used to measure the direction of misalignment between the opener mechanism registration pin and the tool-port platform, as explained below.

FIG. 7a illustrates a registration pin 520 (shown in cross-section) inserted into the eccentric insert opening 510. The pin 520 is depicted as having a central axis 630 which is not aligned with the central axis 601 of the face member opening 222a. Hence, the registration pin 520 is not properly aligned. This misalignment is represented in FIG. 7a by a vector 632 having a direction of misalignment represented by the angle alpha. This direction alpha may be determined by rotating the insert 218e in first one direction such as counterclockwise. Because of the eccentricity of the position of the opening 510, rotating the insert 218e will eventually cause the interior surface of the opening 510 to engage the exterior surface of the registration pin 520 as shown in FIG. 7b (unless the opening 610 is too large).

In the illustrated embodiment, the side 612 of the opening 610 which is positioned farthest from the central axis 601 and closest to the cylindrical body surface 614 of the insert body 602, is marked with a suitable indicia such as the arrow 636. In addition, the face of the door member 226 is marked with suitable directional indicating indicia such as the degree markings indicated at 640. In the example of FIG. 7b, upon rotating the insert 218e in the counterclockwise direction, the point at which the interior surface of the opening 610 engages the exterior surface of the registration pin 520, is indicated by the arrow 636 to be in the direction of 0 degrees. A second reading may then be taken by rotating the insert 218e in the opposite, that is, clockwise direction until the interior surface of the opening 510 again engages the exterior surface of the registration pin 520 as shown in FIG. 7c. There, the point at which the interior surface of the opening 610 engages the exterior surface of the registration pin 520, is indicated by the arrow 636 to be in the direction of 45 degrees. Because of the symmetry of the opening 610, it can then be determined that the direction alpha of misalignment is half way between these two positions, that is 45 minus 0, divided by 2, or 22 and one half degrees.

In the illustration of FIGS. 7a–7e, the size and eccentricity of the opening 610 are depicted in an exaggerated fashion to clarify the explanation of the principles upon which the diagnostic insert may operate. In actual practice, an example of a suitable diameter is 0.5002 in. and a suitable off-axis displacement is 0.007 in. for a SEMI E62-0299 application. Of course, the actual sizes, shapes and positions of the inserts and openings may vary, depending upon the application.

As previously mentioned, the door of a FOUP type carrier is designed to be opened by a pair of latch keys which are inserted by the door opener mechanism into a pair of key holes in the carrier door. Inserts 218b and 218c emulate the key holes of the door to permit testing of the alignment between the latch keys of the door opening mechanism and the load-port.

Figure 8:
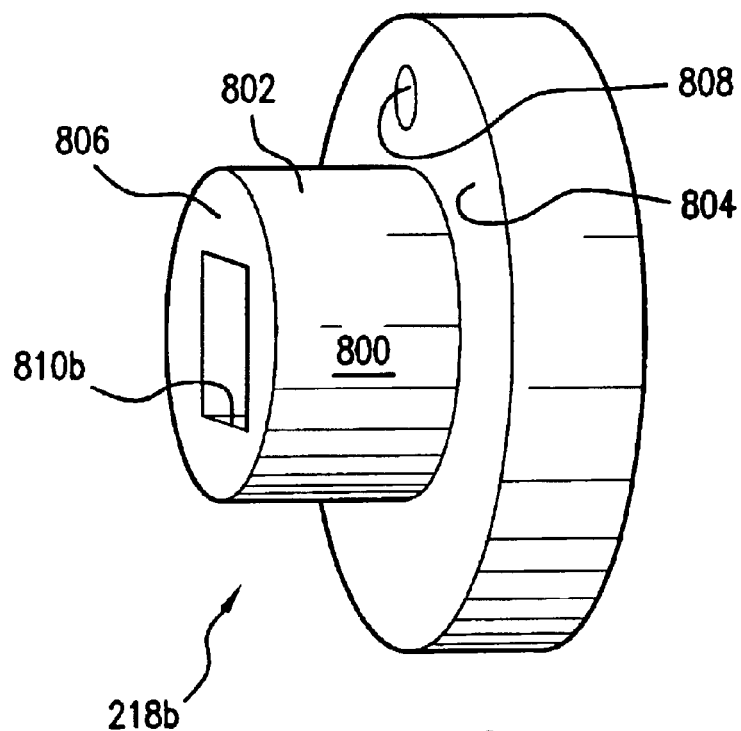
FIG. 8 is a pictorial view of a key alignment insert of the metrology tool system of FIGS. 3a–3c.
Figure 9A:
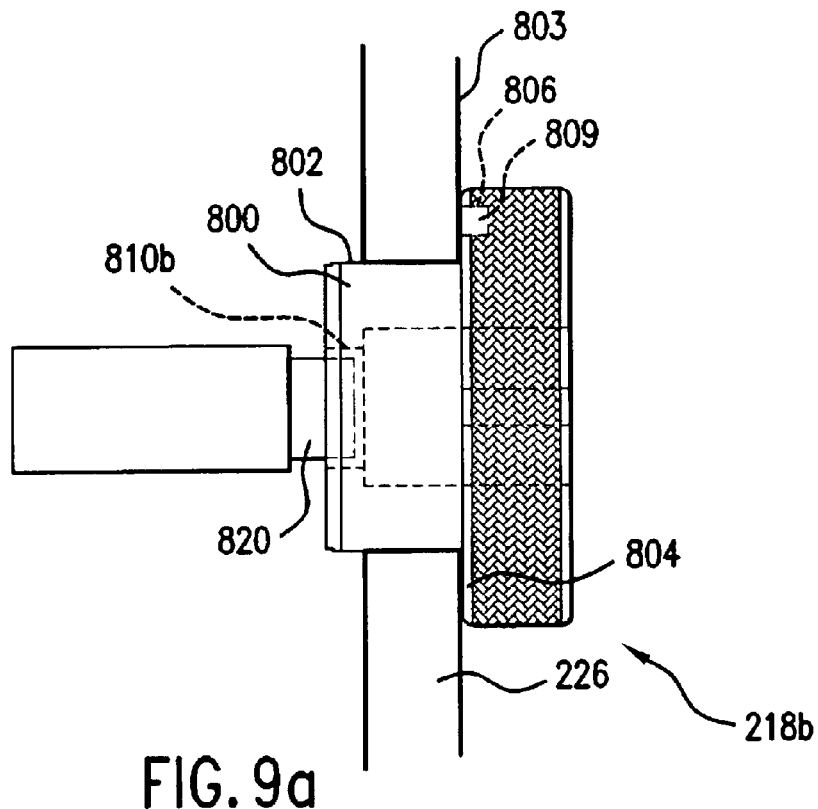
FIGS. 9a and 9b are side partial cross-sectional views of a key being aligned with a key alignment insert of the metrology tool system of FIGS. 3a–3c.
Figure 9B:
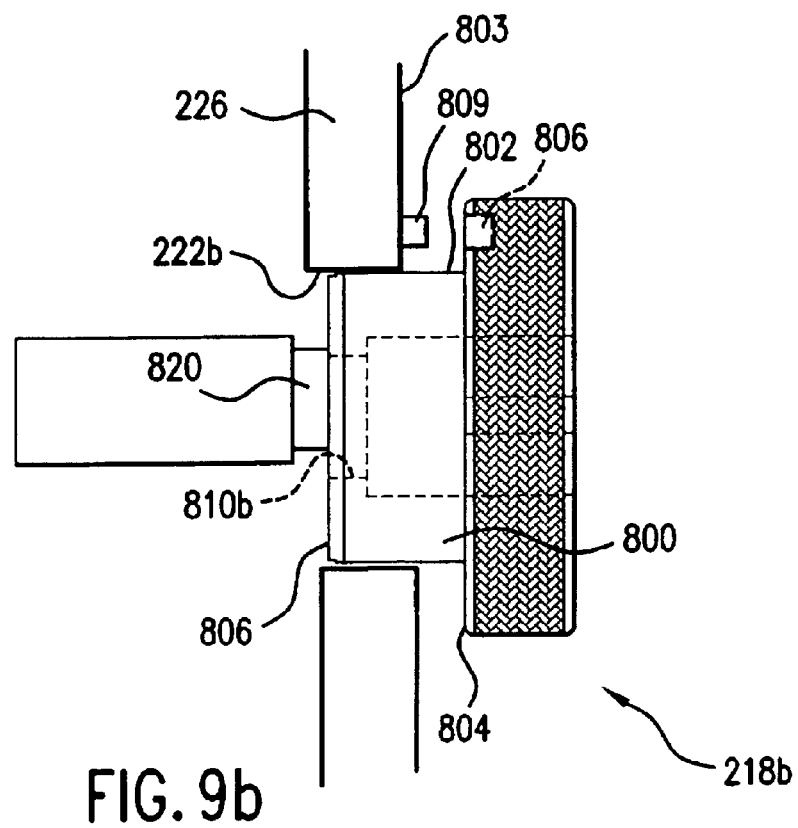

FIGS. 8 and 9a, 9b show the insert 218b having, like the inserts 218a and 218d, a generally cylindrical outer surface 800 of an insert body 802 which is received by the generally cylindrical shaped opening 222b of the door plate member 226. The body 802 of the insert 218b is inserted into the opening 222b from the back side 803 of the door plate member 226 until a flange 804 at the rear of the insert 218b engages the back surface 803 of the door plate member 226. The front surface 806 of the insert 218b defines a generally rectangular-shaped opening 810b which is shaped and dimensioned in accordance with the SEMI standard E62-0299 for one of the two FOUP latch key holes. In this standard, the ends of the opening 810b are rounded with a defined radius of curvature centered in the opening. The flange 804 of the insert 218b defines an opening 808 which receives a registration pin 809 disposed on the back surface 803 of the door plate member 226. When the insert 218b is inserted into the opening 222b of the door plate member 226, and the registration pin 809 is inserted into the flange opening 808 as shown in FIG. 9a, the insert key opening 810b is positioned in accordance with the SEMI standard E62-0299 for one of the two FOUP door alignment key holes. The insert 218c is constructed in a similar manner such that the insert opening 810c of the insert 218c is positioned in accordance with the SEMI standard E62-0299 for the other of the two FOUP door key holes. In this manner, the insert openings 810b and 810c emulate the two SEMI E62-0299 FOUP door key for two latch keys of the factory interface door opening mechanism.

In a manner similar to that of the door opener registration pins of the robot, the alignment of the carrier tool-port to the factory interface FOUP door opener mechanism may be tested by commanding the door opener mechanism of the robot to insert the engagement members or heads 820 of the door opener latch keys into the two key holes 810b and 810c emulating the two key holes of a door of a FOUP type carrier. If the carrier tool-port is properly aligned with respect to the factory interface FOUP door opener mechanism, the head 820 of the carrier door latch key 821 will be received into the corresponding door key hole as illustrated in FIG. 9a for the key hole 810b of the key hole insert 218b. On the other hand, if the door opening mechanism and the tool-port are misaligned, the head 820 of the key 821 of the opener mechanism will engage the front surface 806 of the key hole insert 218b and begin to push the insert 218b out of the opening 222b in the door plate member 226. This movement of the insert provides a clear indication to the operator of the key to key hole misalignment condition.

In the illustrated embodiment, the key hole inserts, like the registration pin hole inserts, are preferably not fastened or otherwise secured to the door plate member such that the inserts can freely slide within the associated plate member opening. As a consequence, should the opener mechanism and carrier tool-port not be properly aligned, the inserts can freely slide indicating misalignment while reducing the danger of accidental damage to the opener mechanism.

Like the registration pin inserts, the alignment tool system 200 may include a plurality of key hole inserts for each plate member opening 222b and 222c. The key hole inserts could differ, for example, by the size of the rectangular openings 810b or 810c of the inserts. Thus, for example, one set of inserts 218b and 218c could have openings 810b and 810c, respectively, which are relatively large, such as a width of 0.2128 inches (5.40512 mm) (approximately 108% of a 5 mm standard) and a length defined by the central radius of curvature of 0.2697 inches (6.85038 mm), for example. These inserts may be used if an alignment to a relatively large key to key hole tolerance is desired for the particular application. Another set of inserts 218b and 218c could have openings 810b and 810c, respectively, which are relatively small, such as a width of 0.2048 inches (5.20192 mm) (approximately 104% of a 5 mm standard) and a length defined by the central radius of curvature of 0.2697 inches (6.85038 mm), for example. These key hole inserts may be used if a key to key hole alignment to a relatively small tolerance is desired for the particular application. Yet another set of inserts 218b and 218c could have openings 810b and 810c, respectively, which are the same as those defined in the applicable standard, such as a width of 0.19685 inches (5 mm) and a length defined by the central radius of curvature of 0.265748 inches (6.5 mm), for example. Depending upon the application, the alignment tool system may include a kit having a number of inserts having a variety of different sized and shaped openings to provide the type of alignment desired.

In the embodiments of FIGS. 5 and 8, the inserts have a registration pin or key opening which is formed concentrically within the cylindrical surface of the body of the insert. It is appreciated that the opening need not be concentric nor the body shaped cylindrically. For example, in applications in which the insert need not rotate, the insert body may be oval or rectangular shaped or have another shape, depending upon the application.

In the illustrated embodiment, a carrier alignment tool and method have been described as being generally compatible with certain SEMI standards. It is recognized that a carrier alignment tool and method in accordance with the present inventions may conform to other standards and proprietary applications.

It will, of course, be understood that modifications of the present invention, in its various aspects, will be apparent to those skilled in the art, some being apparent only after study, others being matters of routine mechanical design. Other embodiments are also possible, their specific designs depending upon the particular application. As such, the scope of the invention should not be limited by the particular embodiments herein described but should be defined only by the appended claims and equivalents thereof.

What is claimed is:

1. A metrology tool for aligning a robot having an engagement member for engaging a semiconductor substrate carrier disposed on a tool load-port, comprising:
   a frame having an opening; and
   a removable alignment gauge member slidably received in said frame opening, said alignment gauge member having an opening to receive said robot engagement member when inserted in said frame opening, wherein said alignment gauge member has a front face positioned to be engaged by said robot engagement member when said robot engagement member is misaligned with respect to said alignment gauge member opening, said alignment gauge member being adapted to slide when said alignment gauge member front face is engaged by said robot engagement member.

2. The tool of claim 1 wherein said robot engagement member is a registration pin and said alignment gauge member opening is sized and shaped to receive said registration pin when said alignment gauge member opening is aligned with respect to said registration pin.

3. The tool of claim 2 wherein said alignment gauge member opening is cylindrically shaped.

4. The tool of claim 1 wherein said frame opening is cylindrically shaped and said removable alignment gauge member has a cylindrically shaped portion adapted to be slidably received by said frame opening.

5. The tool of claim 1 wherein said robot engagement member is a door key and said alignment gauge member opening is sized and shaped to receive said door key when said alignment gauge member opening is aligned with respect to said door key.

6. The tool of claim 5 wherein said alignment gauge member opening is rectangularly shaped.

7. The tool of claim 5 wherein said frame opening is cylindrically shaped and said removable alignment gauge member has a cylindrically shaped portion adapted to be slidably received by said frame opening, said frame further having one of an alignment pin and an alignment pin hole and said alignment gauge member having the other of said alignment pin and said alignment pin hole wherein said alignment pin hole is positioned to align said alignment gauge member to said frame when said alignment pin is received in said alignment pin hole.

8. The tool of claim 1 further comprising a plurality of removable alignment and support receptacles fastened to said frame and positioned to support said frame on said tool load-port.

9. The tool of claim 8 wherein each of said receptacles has four alignment surfaces and said frame has four alignment surfaces for each receptacle, each frame alignment surface being positioned to be engaged by an associated receptacle alignment surface to align the frame and associated receptacle when fastened to the frame.

10. The tool of claim 9 wherein each receptacle has a block-shaped portion which provides said four receptacle alignment surfaces, and wherein said frame has an aperture for each receptacle wherein each frame aperture defines said four frame alignment surfaces which are positioned to receive and align an associated receptacle portion.

11. The tool of claim 10 further comprising a plurality of removable fasteners for fastening each removable receptacle to said frame when said receptacle block-shaped portion is received in said frame aperture.

12. The tool of claim 1 wherein said frame includes a base plate, a frame plate carried by said base plate, and a removable door plate releasably fastened to said frame plate wherein said door plate defines said frame opening.

13. The tool of claim 12 wherein said frame further includes a plurality of alignment pins adapted to align said door plate to said frame plate when said door plate is fastened to said frame plate.

14. The tool of claim 1 wherein said frame opening defines a central axis and said alignment gauge member opening defines a central axis offset with respect to said frame opening central axis, said alignment gauge member being adapted for rotation in said frame opening about said frame opening axis.

15. The tool of claim 14 wherein said alignment gauge member has a first indicia and said frame has a second indicia adjacent said frame opening, said first and second indicia being adapted to provide an indication of the rotational position of said alignment gauge member within said frame opening.

16. The tool of claim 15 wherein at least one of said indicia include angular position indicia expressed in degrees.

17. A metrology tool for aligning a door-opening robot having a pair of registration pins and a pair of latch keys for engaging a pair of registration pin holes and a pair of latch key holes, respectively of a plastic door of a plastic Front-Opening Universal Pod (FOUP) having three plastic receptacles, each receptacle adapted to be disposed on an alignment and support coupling pin of a tool load-port of a factory interface, said metrology tool comprising:
  a metal frame having a metal base plate having three metal receptacles, each receptacle configured and positioned to emulate one of said FOUP receptacles, said frame further having a metal front plate carried by said base plate, and a pair of metal side brace members, each adapted to brace said front plate with respect to said base plate, said front plate defining at least four cylindrical openings;
  first and second cylindrical metal removable registration pin alignment members, each registration pin alignment member being slidably received in a front plate opening and having a cylindrical opening sized and shaped to emulate a FOUP registration pin hole and to receive a robot registration pin when said registration pin alignment member opening is aligned with respect to a robot registration pin, each registration pin alignment member further having a front face positioned to be engaged by a robot registration pin when a robot registration pin is misaligned with respect to the associated registration pin alignment member opening, said registration pin alignment member being adapted to slide when said registration pin alignment member front face is engaged by a robot registration pin; and
  first and second cylindrical metal removable latch key alignment members, each latch key alignment member being slidably received in a front plate opening and having a rectagular opening sized and shaped to emulate a FOUP latch key hole and to receive a robot latch key when said latch key alignment member opening is aligned with respect to a robot latch key, each latch key alignment member further having a front face positioned to be engaged by a robot latch key when a robot latch key is misaligned with respect to the associated latch key alignment member opening, said latch key alignment member being adapted to slide when said latch key alignment member front face is engaged by a robot latch key.

18. A metrology tool kit for aligning a robot having an engagement member for engaging a semiconductor substrate carrier disposed on a load port tool, comprising
  a frame having an opening; and
  a plurality of removable alignment gauge members, each alignment gauge member being adapted to be selectably inserted and removed from said frame opening one at a time, each member having an opening to receive said robot engagement member when inserted in said frame opening wherein said member openings differ in size, wherein a first alignment gauge member of said plurality has a member opening of a first size and a second alignment gauge member of said plurality has a member opening of a size approximately 100.2% of said first size.

19. The tool kit of claim 18 wherein a first alignment gauge member of said plurality has a member opening of a first size and a second alignment gauge member of said plurality has a member opening of a size approximately 104% of said first size.

20. The tool kit of claim 18 wherein a first alignment gauge member of said plurality has a member opening of a first size and a second alignment gauge member of said plurality has a member opening of a size approximately 108% of said first size.

21. A metrology tool for aligning a robot having a pair of registration pins and a pair of latch keys for engaging a door of a substrate carrier disposed on a tool load-port, comprising:

a frame adapted to be disposed in said tool-load port and having at least four openings;

first and second removable registration pin alignment members, each registration pin alignment member being slidably received in a frame opening and having an opening sized and shaped to receive a robot registration pin when said registration pin alignment member opening is aligned with respect to a robot registration pin, each registration pin alignment member further having a front face positioned to be engaged by a robot registration pin when a robot registration pin is misaligned with respect to the associated registration pin alignment member opening, said registration pin alignment member being adapted to slide when said registration pin alignment member front face is engaged by a robot registration pin; and first and second removable latch key alignment members, each latch key alignment member being slidably received in a frame opening and having an opening sized and shaped to receive a robot latch key when said latch key alignment member opening is aligned with respect to a robot latch key, each latch key alignment member further having a front face positioned to be engaged by a robot latch key when a robot latch key is misaligned with respect to the associated latch key alignment member opening, said latch key alignment member being adapted to slide when said latch key alignment member front face is engaged by a robot latch key.

22. A metrology tool for aligning a robot having a carrier door key for unlatching a carrier door of a substrate carrier disposed on a tool load-port, comprising:

carrier frame emulation means for resting on said tool load-port and for emulating a substrate carrier frame; and door emulation means carried by said carrier frame emulation means for emulating a door of said substrate carrier, said door emulation means having an opening and a removable alignment gauge means slidably carried in said door emulation means opening for gauging alignment of a robot carrier door key, said alignment gauge means including opening means for emulating a door key opening, wherein said alignment gauge opening means receives said robot carrier door key when said alignment gauge opening means is carried in alignment with said robot carrier door key and wherein said alignment gauge means slides in response to being engaged by said robot carrier door key when said alignment gauge means opening is carried in misalignment with said robot carrier door key.

23. A method of aligning a robot engagement member to a door opening of a carrier door of a substrate carrier disposed on a tool load-port, comprising:

disposing a frame emulating a carrier frame on said tool load-port;

placing a first alignment gauge insert into an opening in said frame; and driving said robot engagement member toward said alignment gauge insert wherein an opening in said alignment gauge insert receives said robot engagement member when said alignment gauge insert opening is in alignment with said robot engagement member and wherein said alignment gauge insert slides in response to being engaged by said robot engagement member when said alignment gauge insert opening is misaligned with said robot engagement member.

24. The method of claim 23 wherein said robot engagement member is a registration pin and said alignment gauge insert opening is sized and shaped to receive said registration pin when said alignment gauge insert opening is aligned with respect to said registration pin.

25. The method of claim 24 wherein said robot engagement member is a door key and said alignment gauge insert opening is sized and shaped to receive said door key when said alignment gauge insert opening is aligned with respect to said door key.

26. The method of claim 23 further comprising removing an alignment and support receptacle from said frame; fastening a substitute alignment and support receptacle to said frame; and positioning said frame substitute alignment and support receptacle on said tool load-port.

27. The method of claim 26 further comprising engaging four alignment surfaces of said substitute receptacle with four alignment surfaces of said frame to align said substitute receptacle with said frame prior to fastening said substitute receptacle to said frame.

28. The method of claim 27 wherein said substitute receptacle has a block-shaped portion which provides said four receptacle alignment surfaces, and wherein said frame has an aperture which defines said four frame alignment surfaces, said alignment surface engaging including positioning said block-shaped portion of said substitute receptacle in said frame alignment aperture.

29. The method of claim 28 wherein said fastening comprises fastening removable fasteners fastening said substitute receptacle to said frame when said receptacle block-shaped portion is received in said frame aperture.

30. The method of claim 23 wherein said frame includes a base plate, a frame plate carried by said base plate, and a removable door plate releasably fastened to said frame plate wherein said door plate defines said frame opening, the method further comprising removing said door plate from said frame plate and fastening a substitute door plate to said frame plate.

31. The method of claim 30 further comprising aligning said substitute door plate to said frame plate using alignment pins prior to fastening said substitute door plate to said frame plate.

32. The method of claim 23 further comprising removing said first alignment gauge insert from said frame and placing a substitute alignment gauge insert in said frame opening wherein said substitute alignment gauge insert opening has an opening which is smaller in size than said first alignment gauge insert opening, said method further comprising driving said robot engagement member toward said substitute alignment gauge insert wherein said opening in said substitute alignment gauge receives said robot engagement member when said substitute alignment gauge insert opening is in alignment with said robot engagement member and wherein said substitute alignment gauge insert slides in response to being engaged by said robot engagement member when said alignment gauge insert opening is misaligned with said robot engagement member.

33. The method of claim 32 wherein said first alignment gauge insert opening is 108% of the size of said substitute alignment gauge insert opening.

34. The method of claim 32 wherein said first alignment gauge insert opening is 104% of the size of said substitute alignment gauge insert opening.

35. The method of claim 32 wherein said first alignment gauge insert opening is 100.2% of the size of said substitute alignment gauge insert opening.

36. The method of claim 23 wherein said frame opening defines a central axis and said alignment gauge insert opening defines a central axis offset with respect to said frame opening central axis, said alignment gauge insert being adapted for rotation in said frame opening about said frame opening axis, said method further comprising rotating said alignment gauge insert in a first rotational direction until said engagement member engages an internal surface of said alignment gauge insert opening.

37. The method of claim 36 wherein said alignment gauge insert has a first indicia and said frame has a second indicia adjacent said frame opening and adapted to provide an indication of the rotational position of said first indicia of said alignment gauge insert within said frame opening, said method further comprising noting the indicated rotational position when said engagement member engages an internal surface of said alignment gauge insert opening.

38. A method of aligning a door-opening robot having a pair of registration pins and a pair of latch keys for engaging a pair of registration pin holes and a pair of latch key holes, respectively of a plastic door of a plastic Front-Opening Universal Pod (FOUP) having three plastic receptacles, each receptacle adapted to be disposed on an alignment and support coupling pin of a tool load-port of a factory interface, comprising:
  disposing a metal frame having three metal receptacles on a plurality of alignment and support coupling pins of a tool load-port of a factory interface, each receptacle configured and positioned to emulate one of said FOUP receptacles on said tool load-port;
  placing a metal registration pin alignment gauge insert into an opening in said frame, wherein said registration pin alignment gauge insert has an opening sized and shaped to emulate a FOUP registration pin hole and to receive said robot registration pin when said registration pin alignment gauge insert opening is aligned with respect to said robot registration pin;
  driving said robot registration pin toward said registration pin alignment gauge insert wherein said registration pin alignment gauge insert opening receives said robot registration pin when said registration pin alignment gauge insert opening is in alignment with said robot registration pin and wherein said registration pin alignment gauge insert slides in response to being engaged by said robot registration pin when said registration pin alignment gauge insert opening is misaligned with said robot registration pin;
  placing a metal latch key alignment gauge insert into an opening in said frame, wherein said latch key alignment gauge insert has an opening sized and shaped to emulate a FOUP latch key hole and to receive said robot latch key when said latch key alignment gauge insert opening is aligned with respect to said robot latch key; and
  driving said robot latch key toward said latch key alignment gauge insert wherein said latch key alignment gauge insert opening receives said robot latch key when said latch key alignment gauge insert opening is in alignment with said robot a latch key and wherein said latch key alignment gauge insert slides in response to being engaged by said robot latch key when said latch key alignment gauge insert opening is misaligned with said robot latch key.

39. A method of aligning a robot registration pin and a robot latch key to a carrier door of a semiconductor substrate carrier disposed on a tool load-port, comprising:
  disposing a frame emulating a carrier frame on said tool load-port;
  placing a registration pin alignment gauge insert into an opening in said frame, wherein said registration pin alignment gauge insert has an opening sized and shaped to receive said robot registration pin when said registration pin alignment gauge insert opening is aligned with respect to said robot registration pin;
  driving said robot registration pin toward said registration pin alignment gauge insert wherein said registration pin alignment gauge insert opening receives said robot registration pin when said registration pin alignment gauge insert opening is in alignment with said robot registration pin and wherein said registration pin alignment gauge insert slides in response to being engaged by said robot registration pin when said registration pin alignment gauge insert opening is misaligned with said robot engagement member;
  placing a latch key alignment gauge insert into an opening in said frame, wherein said latch key alignment gauge insert has an opening sized and shaped to receive said robot latch key when said latch key alignment gauge insert opening is aligned with respect to said robot latch key; and
  driving said robot latch key toward said latch key alignment gauge insert wherein said latch key alignment gauge insert opening receives said robot latch key when said latch key alignment gauge insert opening is in alignment with said robot a latch key and wherein said latch key alignment gauge insert slides in response to being engaged by said robot latch key when said latch key alignment gauge insert opening is misaligned with said robot engagement member.

40. A method of aligning a door-opening robot having a pair of registration pins and a pair of latch keys for engaging a pair of registration pin holes and a pair of latch key holes, respectively of a plastic door of a plastic Front-Opening Universal Pod (FOUP) having three plastic receptacles, each receptacle adapted to be disposed on an alignment and support coupling pin of a tool load-port of a factory interface, comprising:
  disposing a metal frame having three metal receptacles on a plurality of alignment and support coupling pins of a tool load-port of a factory interface, each receptacle configured and positioned to emulate one of said FOUP receptacles on said tool load-port;
  placing a metal registration pin alignment gauge insert into an opening in said frame, wherein said registration pin alignment gauge insert has an opening sized and shaped to emulate a FOUP registration pin hole and to receive said robot registration pin when said registration pin alignment gauge insert opening is aligned with respect to said robot registration pin;

driving said robot registration pin toward said registration pin alignment gauge insert wherein said registration pin alignment gauge insert opening receives said robot registration pin when said registration pin alignment gauge insert opening is in alignment with said robot registration pin and wherein said registration pin alignment gauge insert slides in response to being engaged by said robot registration pin when said registration pin alignment gauge insert opening is misaligned with said robot registration pin;

placing a metal latch key alignment gauge insert into an opening in said frame, wherein said latch key alignment gauge insert has an opening sized and shaped to emulate a FOUP latch key hole and to receive said robot latch key when said latch key alignment gauge insert opening is aligned with respect to said robot latch key; and driving said robot latch key toward said latch key alignment gauge insert wherein said latch key alignment gauge insert opening receives said robot latch key when said latch key alignment gauge insert opening is in alignment with said robot a latch key and wherein said latch key alignment gauge insert slides in response to being engaged by said robot latch key when said latch key alignment gauge insert opening is misaligned with said robot latch key.

* * * * *